United States Patent
Lockman et al.

(10) Patent No.: US 7,665,056 B1
(45) Date of Patent: Feb. 16, 2010

(54) METHOD AND SYSTEM FOR DYNAMIC PLACEMENT OF BOND FINGERS ON INTEGRATED CIRCUIT PACKAGE

(75) Inventors: Tyler James Lockman, Embrun (CA); James A. Dean, Ottawa (CA); Jean-Marc Ng Wing Keng, Ottawa (CA)

(73) Assignee: Cadence Design Systems, Inc., San Jose, CA (US)

( * ) Notice: Subject to any disclaimer, the term of this patent is extended or adjusted under 35 U.S.C. 154(b) by 327 days.

(21) Appl. No.: 11/354,826

(22) Filed: Feb. 16, 2006

(51) Int. Cl.
*G06F 17/50* (2006.01)

(52) U.S. Cl. .................................. 716/11; 438/617

(58) Field of Classification Search ............... 716/1–18; 438/612–617
See application file for complete search history.

(56) References Cited

U.S. PATENT DOCUMENTS

| | | | |
|---|---|---|---|
| 5,245,214 A | * | 9/1993 | Simpson ..................... 257/666 |
| 6,787,901 B2 | * | 9/2004 | Reyes et al. .................. 257/724 |
| 2002/0042904 A1 | * | 4/2002 | Ito et al. ......................... 716/8 |
| 2002/0084982 A1 | * | 7/2002 | Rosenberg .................. 345/157 |
| 2004/0017371 A1 | * | 1/2004 | Shen et al. .................. 345/440 |

\* cited by examiner

*Primary Examiner*—Jack Chiang
*Assistant Examiner*—Aric Lin
(74) *Attorney, Agent, or Firm*—Rosenberg, Klein & Lee (57) ABSTRACT

Various embodiments of the present invention relate to a method, system, and computer program product for dynamic placement of various bond fingers on an integrated circuit (IC) package. This is achieved by determining the placement of selected bond fingers. Subsequently, bond fingers and bond wires are identified, which have been affected due to the placement of the selected bond fingers. Further, the placement of the selected and the affected bond fingers is determined based on clearance rules and the affected bond fingers and bond wires. This facilitates the dynamic placement of the various bond fingers in interaction with the user. Further, the user is provided with full interactive access and control over the method and system.

22 Claims, 9 Drawing Sheets

METHOD AND SYSTEM FOR DYNAMIC PLACEMENT OF BOND FINGERS ON INTEGRATED CIRCUIT PACKAGE

BACKGROUND

The present invention relates to wirebonding. More particularly, the present invention relates to dynamic placement and adjustment of bond fingers on an Integrated Circuit (IC) package.

Wirebonding is a technique for establishing electrical connectivity between an IC component and a package substrate. This involves soldering wires between two pads. The first pad is on an IC's top metal layer, which is exposed through a passivation opening and the second pad is on the package substrate, which is exposed through an opening in a solder mask layer. The wire follows a three-dimensional (3D) profile through the surrounding air, instead of following a two-dimensional (2D) path. Generally, the 2D path is followed during a single-layer trace.

The fundamental difference with the 3D profile of the wire arises because the bond wires float in space. As a result, they follow a completely free path in all the three axes. Further, bond wires are subjected to flexing and bending during the manufacturing process. By way of example, the bond wires may flex and bend when the air beneath the wires gets filled as a part of the final manufacturing process. The greater the separation between two neighboring bond wires, the greater the rate of fill. Therefore, the pressure on the bond wires varies across a wirebond pattern. This results in various design problems and wirebond-related shorts. Wirebond-related shorts refer to failures that involve the occurrence of unintended electrical shorting between the bond wires. These include bond-to-bond shorting, wire-to-die shorting, and wire-to-wire shorting.

Several conventional methods have been used to compute the placement and rotation of the bond fingers on the package substrate by using auto-routing technologies for a 2.5-dimensional (2.5D) problem. These auto-routing technologies also compute the end points of the bond wires that are attached to the power and ground rings on the package surface. By way of example, consider a wirebond pattern with two rows of bond fingers, one power, and one ground ring. While ring tack points follow the mid-point of the shape outline, the placement of the bond fingers follows pre-defined user path(s). These paths may be straight-line segments, arcs, or a combination thereof. Further, the placement of the bond fingers is governed by a complex set of physical and spacing rules.

Such rules are applied to the bond fingers and the bond wires. By way of example, in accordance with the rules, two bond wires at the same height cannot cross each other. However, two bond wires that are at different heights, though originating from the same die, may cross as long as the vertical spacing between them is sufficient. Further, auto-routing technologies involve running conducting traces at any angle in the x- and y-axis, but are limited to orthogonal movement in the z-axis. For this reason, wirebonding, which is a 3D problem, is not addressed by auto-routing technologies.

The 3D problem has been solved by another wirebond algorithm. This algorithm is based on batch-driven pattern cleanup. The control values for the batch-driven pattern are entered by the user. If failures occur, the user modifies one or more control values and runs the batch process again. Such a batch-driven pattern involves trial and error during pattern refinement. Any refinements made to the pattern later, when necessitated by design of the rest of the package substrate, must be performed in a similar trial-and-error model.

Another wirebond algorithm that reduces trial and error during pattern refinement involves automatic initial generation, which is based on highly customizable placement rules and parameters. These values are stored after initial setup, and can be recalled to correct and update the pattern on the fly as the user requests changes. However, these parameters result in high levels of tweaking and render the user interface cumbersome.

In light of the foregoing discussion, a need exists for a method and system for dynamic placement and adjustment of bond fingers on an IC package. Such an algorithm should be applicable for 3D routing problems. The present invention addresses such a need.

SUMMARY

Aspects for dynamic placement and adjustment of various bond fingers on an integrated circuit (IC) package include determining placement of bond fingers selected by a user. Subsequently, affected bond fingers and bond wires are identified. The affected bond fingers are the various bond fingers that must be modified due to the placement of the selected bond fingers in order to maintain a violation-free pattern. Further, the placement of the various bond fingers is determined based on clearance rules and the affected bond fingers and bond wires. Such determination of the placement of the various bond fingers occurs along an arbitrary path. Further, the invention relates to an Application Interface (API) to interface the system for dynamic placement and adjustment of the various bond fingers with another system. Furthermore, the invention relates to the formation of an extensible markup language (XML) DTD definition for specifying the details of the pattern of the various bond fingers in an XML format in a file for the purpose of design reuse across multiple IC package designs.

The present invention facilitates the dynamic placement and adjustment of the various bond fingers on the IC package with the user in an interactive manner. Such a method can be applied to complex designs where the power and ground rings may include holes and splits. Further, the user is provided with full interactive access and control over the method and system. The API and Graphical User Interface (GUI) facilitates a user to update a wirebond pattern without understanding the clearance rules, since information is provided dynamically regarding any errors which will be caused due to the current action(s). Further, the XML file that includes the details of the pattern of the various bond fingers can be scaled and imported into another design. This makes the wirebond pattern usable for multiple die sizes. These and other advantages will be more fully appreciated in conjunction with the following detailed description and accompanying drawings.

BRIEF DESCRIPTION OF THE DRAWINGS

Various embodiments of the present invention will hereinafter be described in conjunction with the appended drawings, provided to illustrate and not to limit the present invention, wherein like designations denote like elements, and in which.

DESCRIPTION OF VARIOUS EMBODIMENTS

Various embodiments of the present invention relate to a method, system and computer program product for dynamic placement and adjustment of various bond fingers on an integrated circuit (IC) package. This is achieved by determining the placement of selected bond fingers, which are selected by a user. Subsequently, affected bond fingers and bond wires are identified. The affected bond fingers are bond fingers that are affected due to the placement of the selected bond fingers. In order to maintain a violation-free pattern, the affected bond fingers must be modified. Further, the placement of the selected and the affected bond fingers is determined, based on clearance rules and the affected bond fingers and bond wires. Such determination of the placement of the various bond fingers occurs out along a set of arbitrary paths.

Figure 1:
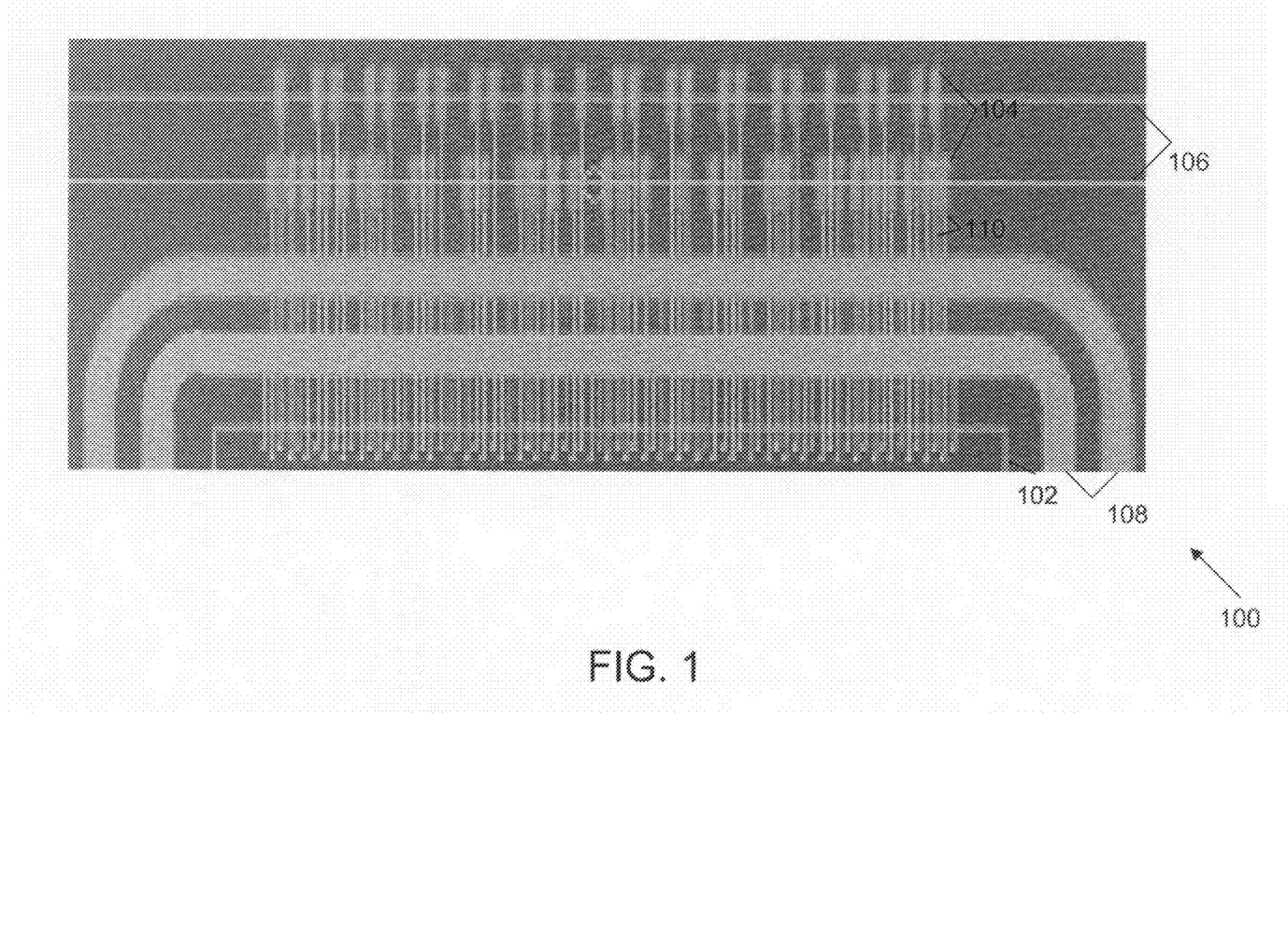
FIG. 1 illustrates an example wirebond pattern, in accordance with an embodiment of the present invention.

FIG. 1 illustrates an example wirebond pattern 100, in accordance with an embodiment of the present invention. Wirebond pattern 100 includes an IC boundary 102, two rows of bond fingers 104, guide paths 106, power/ground rings 108, and bond wires 110. In accordance with an embodiment of the present invention, bond fingers 104 are connected to at least one single die, two or more stacked die in a package, or a combination thereof. In accordance with another embodiment of the present invention, bond fingers 104 can be at least one of regular, single-connection fingers, merged bond fingers, bond fingers specifying more than one wire connection point, or a combination thereof.

The placement of bond wires 110 connecting to power/ground rings 108 follow the middle of the ring, as defined by the midpoint between the two points upon which a vector representing a bond wire would cross the boundary of the ring. The placement of bond fingers 104 follow guide paths 106 defined by the user. Guide paths 106 can be unique, relative to other guide paths. Guide paths 106 can be of the same type. Guide paths 106 can be composed of a combination of one or more arc and straight line segments. By way of example, each of guide paths 106 is composed of a single straight line. The placement of bond fingers 104 and bond wires 110 is critical in 3-dimensional (3D) routing and has been explained in conjunction with various figures.

Figure 2:
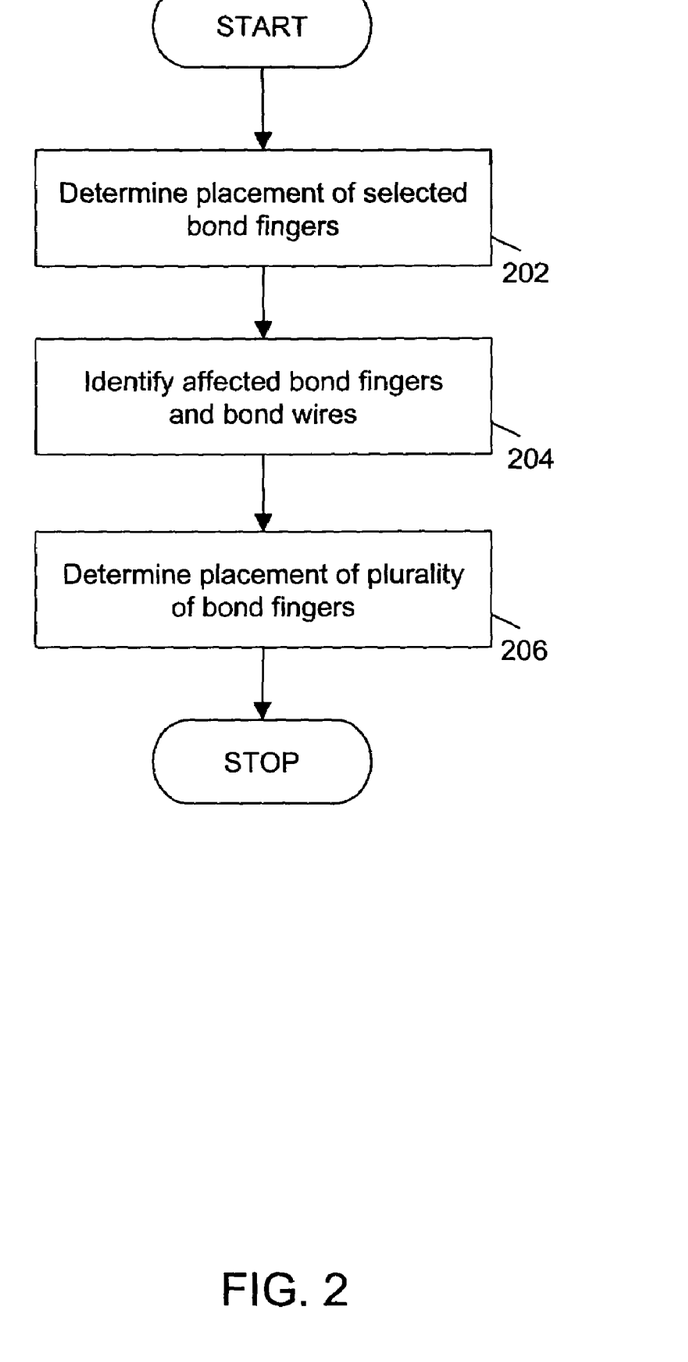
FIG. 2 illustrates a flowchart for the placement of bond fingers on an integrated circuit (IC) package, in accordance with an embodiment of the present invention.

FIG. 2 illustrates a flowchart for placement of bond fingers 104 on the IC package, in accordance with an embodiment of the present invention. At act 202, the placement of selected bond fingers is determined. The selected bond fingers are the bond fingers selected by the user. The determination of the selected bond fingers includes, by way of example, snapping a cursor position to the nearest guide path to form the location of a first selected bond finger. The act of determining the placement of the selected bond fingers has been explained further in conjunction with FIG. 3 and acts 502-504 of FIGS. 5a and 5b.

Once the placement of the selected bond fingers is determined, then act 204 is performed. At act 204, affected bond fingers and bond wires are identified. The affected bond fingers are the bond fingers that have been affected due to the placement of the selected bond fingers, as determined in act 202. The affected bond fingers are determined, based on the space constraints of the first selected bond finger. The act of determining the affected bond fingers has been illustrated in conjunction with FIG. 3 and acts 506-512 of FIGS. 5a and 5b.

Subsequently, the placement of bond fingers 104 is determined at act 206. Such determination of the placement of bond fingers 104 is based on clearance rules and the affected bond fingers and bond wires. The placement of bond fingers 104 is determined along an existing guide path. The act of determining the placement of bond fingers 104 includes the provision of a new origin location for bond fingers. Further, a scan is performed to identify additional bond fingers that require adjustment, based on the new placement of bond fingers. The act of determining the placement of bond fingers 104 has been explained in conjunction with FIG. 4 and acts 516-524 in FIGS. 5a and 5b.

Figure 3:
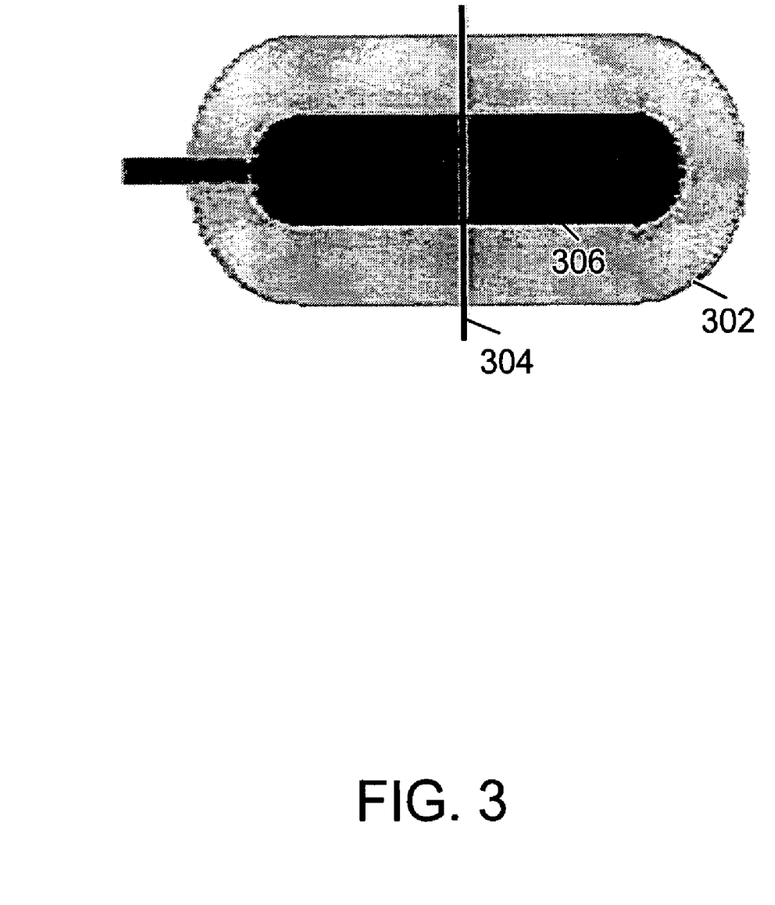
FIG. 3 illustrates an expanded bond finger polygon, in accordance with an embodiment of the present invention.

FIG. 3 illustrates a first expanded bond finger polygon 302, in accordance with an embodiment of the present invention. The figure also includes a nearest guide path 304 and a first bond finger polygon 306. First expanded bond finger polygon 302 facilitates the identification of the affected bond fingers, as mentioned in act 204 of FIG. 2. The affected bond fingers are formed due to the placement of the selected bond fingers. Such selected bond fingers are selected by the user. The first selected bond finger is a selected bond finger that is closest to nearest guide path 304. The identification of the affected bond fingers and bond wires includes determining a maximum clearance. The maximum clearance depends on the spacing constraints of the first selected bond finger.

Subsequently, the image of the first selected bond finger is provided to the user. The image can be provided to the user through an interface. By way of example, the interface can be in the form of a representation of the first selected bond finger drawn at the user's cursor position on a screen. The cursor position can be controlled by a cursor control device. The image of the first selected bond finger is then converted into a polygon to form first bond finger polygon 306, which is expanded, based on the maximum clearance to form first expanded bond finger polygon 302. The bond fingers within first expanded bond finger polygon 302 are the affected bond fingers and bond wires. The affected bond fingers and wires can be used for determining placement of bond fingers 104. This has been explained in detail in conjunction with FIG. 4.

Figure 4:
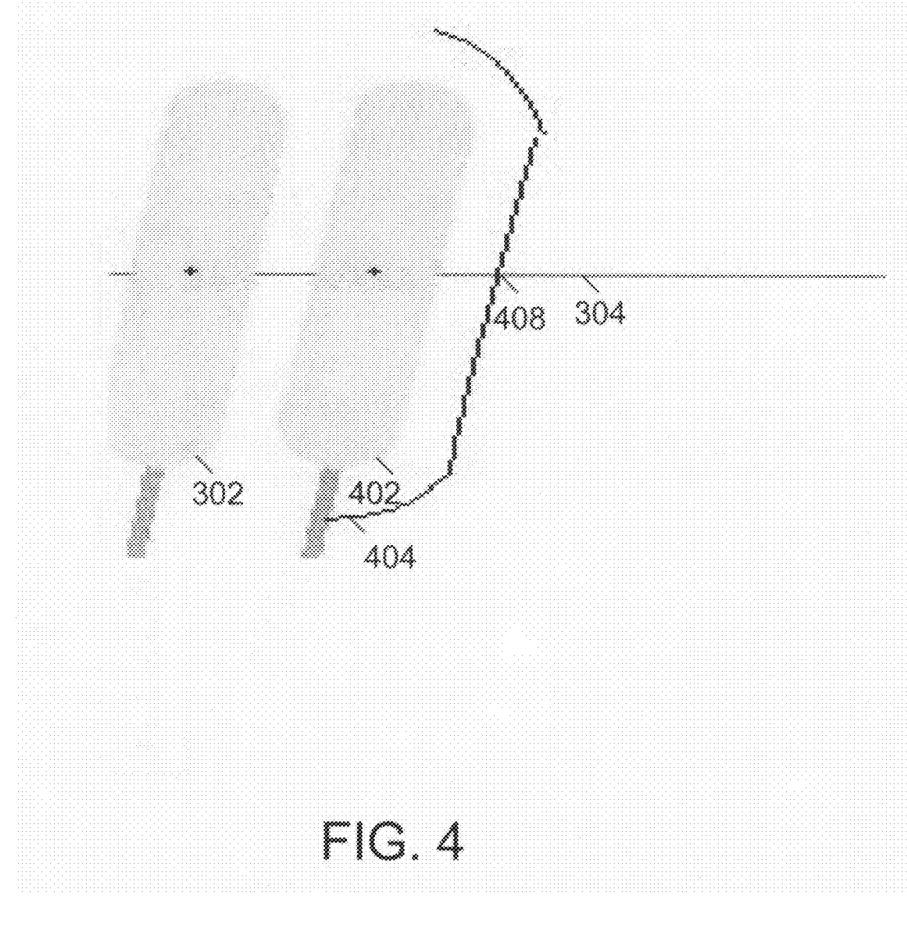
FIG. 4 illustrates two expanded bond finger polygons, in accordance with another embodiment of the present invention.

FIG. 4 illustrates first expanded bond finger polygon 302 and second expanded bond finger polygon 402, in accordance with an embodiment of the present invention. Second expanded bond finger polygon 402 corresponds to a second selected bond finger. First expanded bond finger polygon 302 and second expanded bond finger polygon 402 are used to determine the placement of bond fingers 104. As illustrated, an expansion 404 of half of second expanded bond finger polygon 402 is used to determine the placement of bond fingers 104. An intersection 408 of nearest guide path 306 with expansion 404 provides a new location of a moving bond finger by the user through the cursor. A detailed explanation for determining the placement of bond fingers 104 has been provided in acts 516-524 in FIGS. 5a and 5b.

In accordance with an embodiment of the present invention, determining the placement of bond fingers 104 can be based on the bonding order of the first selected bond finger. The first selected bond finger is taken as the middle of all the selected bond fingers. The middle of the selected bond fingers is determined using a radial sort of the selected bond fingers and the IC pins about the center of the IC component.

Figure 5A:
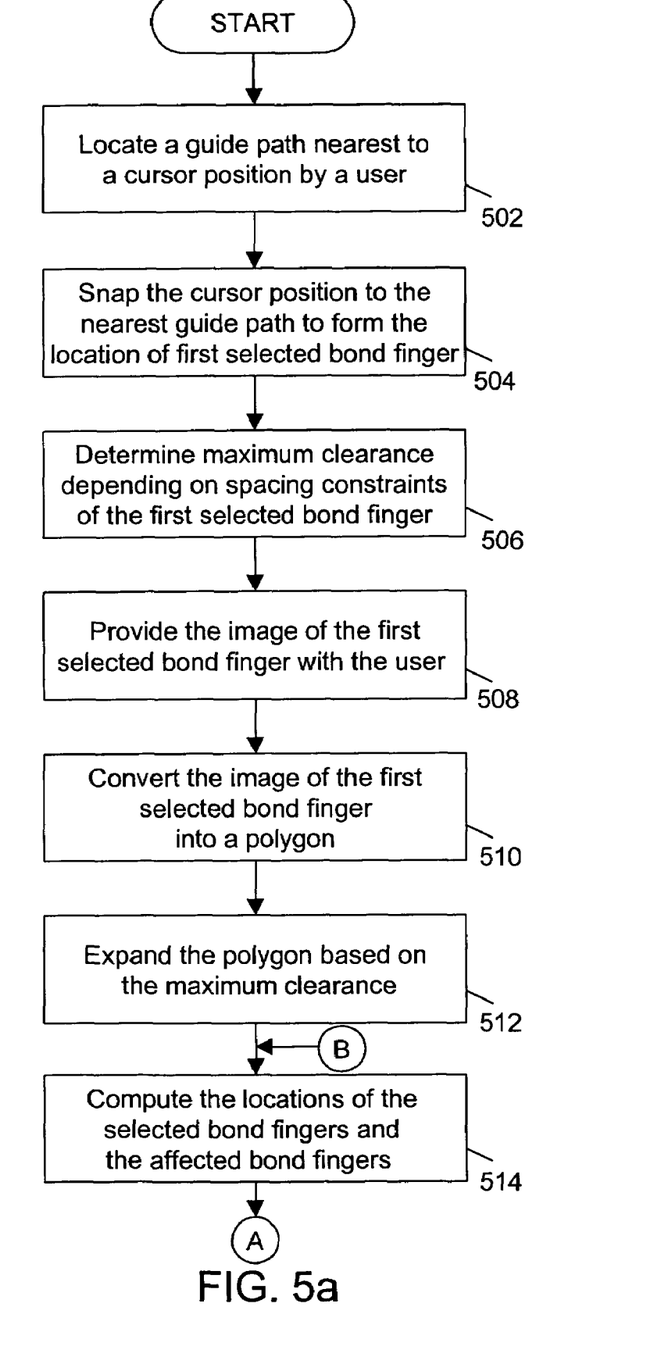
FIGS. 5a and 5b illustrate a flowchart for the placement of bond fingers on an IC package, in accordance with an embodiment of the present invention.
Figure 5B:
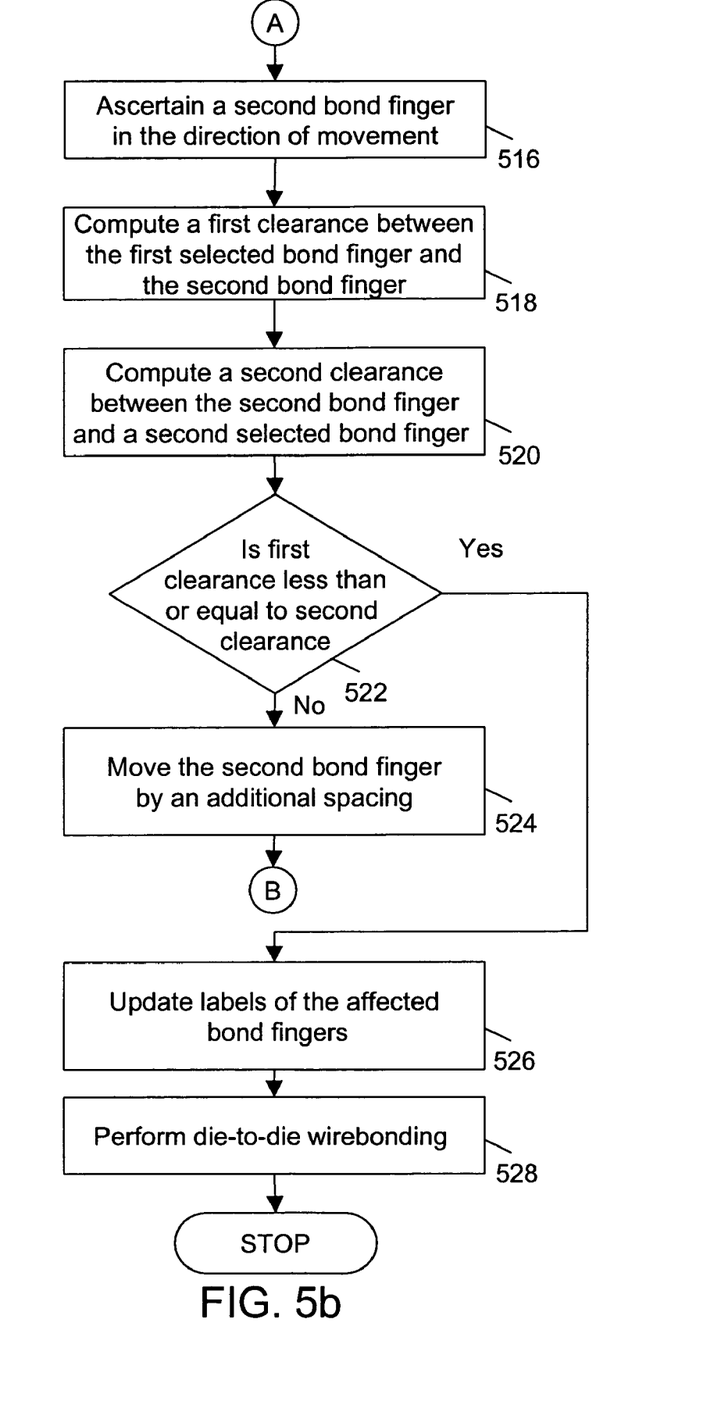

FIGS. 5a and 5b illustrate a flowchart for the placement of bond fingers 104 on the IC package, in accordance with an embodiment of the present invention. This includes determining the placement of the selected bond fingers, which are selected by the user from bond fingers 104. The act of determining the selected bond fingers includes acts 502 and 504. At act 502, a guide path nearest to the cursor position is located by the user. This results in the formation of nearest guide path 306. At act 504, the cursor position is snapped to nearest guide path 306 to form the location of the first selected bond finger.

At act 506, a maximum clearance is determined, based on the spacing constraints of the first selected bond finger. At act 508, the image of the first selected bond finger is provided to the user. At act 510, the image of the first selected bond finger is converted into a polygon. This results in the formation of first bond finger polygon 304. At act 512, the polygon is expanded, based on the maximum clearance determined at act 506. This result in the formation of first expanded bond finger polygon 302, which includes the affected bond fingers and bond wires. Accordingly, the affected bond fingers and wires are determined.

Subsequently, the affected bond fingers and bond wires are used to determine the placement of bond fingers 104, which is determined along an arbitrary path. At act 514, the locations of the selected and affected bond fingers are computed. Such a computation begins with the first selected bond finger and continues till the end of wirebond pattern 100. In accordance with an embodiment of the present invention, the computation is performed by considering bond fingers 104 first in the clockwise direction and then in the counter-clockwise direction, relative to the first selected bond finger.

At act 516, a second bond finger is ascertained in the direction of movement. The second bond finger is different from the first selected bond finger. At act 518, a first clearance is computed between the first selected bond finger and the second bond finger. The first clearance is computed, based on a pre-determined value.

In accordance with an embodiment of the present invention, the pre-determined value can be based on at least one of: the net assignments of bond fingers 104, the constraint rules for the package substrate design, any additional space required for routing channels between the first and second bond fingers, and any pre-existing additional spacing between the first and second bond fingers which must be maintained.

At act 520, a second clearance is computed between the second bond finger and a second selected bond finger. The second selected bond finger is selected by the user. At act 522, the first clearance is compared with the second clearance. If the first clearance is less than or equal to the second clearance, then control is transferred to acts 526 and 528.

However, if the second clearance is less than the first clearance, then act 524 is performed. At act 524, the second bond finger is moved by an additional spacing. Acts 514-524 are repeated for the new location of the bond fingers and until the exact clearance requirement is restored for each of the selected and affected bond fingers.

Once each of bond fingers 104 is adjusted, the updated labels of the affected bond fingers are computed. The labels of bond fingers 104 signify their sorted location within the bond finger pattern surrounding a specific IC or set of stacked IC components. Exact ordering specifications (clockwise/counter-clockwise, sorted by die pad location or by bond finger location) and label prefixes are configured by the user. Each of bond fingers 104 have a unique label. This label can be used for identifying a bond finger to which the die pad needs to be wire bonded to, during the manufacturing process. The adjustment of bond fingers 104 results in a change in the labels of bond fingers 104. This necessitates updating the labels of the affected bond fingers. The affected bond fingers are identified based on the label pattern in use and the operation performed on bond fingers 104. The addition or deletion of bond fingers 104 can result in the label of bond fingers 104 being adjusted. The movement of bond fingers 104 results in changes in the labels only of bond fingers 104, occurring between the first and last affected bond fingers.

Further, the bonding order needs to be updated if the user swaps the positions of bond fingers 104. The swapping of bond fingers 104 needs to be remembered for future operations, and therefore, necessitates updating the bonding order. Furthermore, for any registered callbacks, other items need to be updated. By way of example, the other items include routing traces. This is carried out so as to compensate for the movement of bond fingers 104.

At act 526, the labels of the affected bond fingers are updated. The labels are affected due to the addition, deletion or re-positioning of the affected bond fingers and bond wires. The act of updating the affected bond fingers is explained in conjunction with FIG. 7. At act 528, die-to-die wirebonding is performed. The die-to-die wirebonding is further explained in detail in conjunction with FIG. 6.

In accordance with an embodiment of the present invention, FIGS. 5a and 5b facilitate dynamic placement and adjustment of bond fingers 104. Further, the placement of bond fingers 104 occurs in an interactive manner with the user. As illustrated, the user selects the first and second selected bond fingers. The placement of bond fingers 104 is then performed, based on these selected bond fingers. While the user moves the selected fingers, the algorithm determines the localized area of affect for these changes. This area, which expands, contracts, and shifts as the cursor is moved, determines bond fingers 104 and bond wires 110 that must be adjusted due to these changes. After this the adjustment of bond fingers 104 is carried out dynamically. Bond fingers 104 are adjusted and simultaneously updated.

Figure 6:
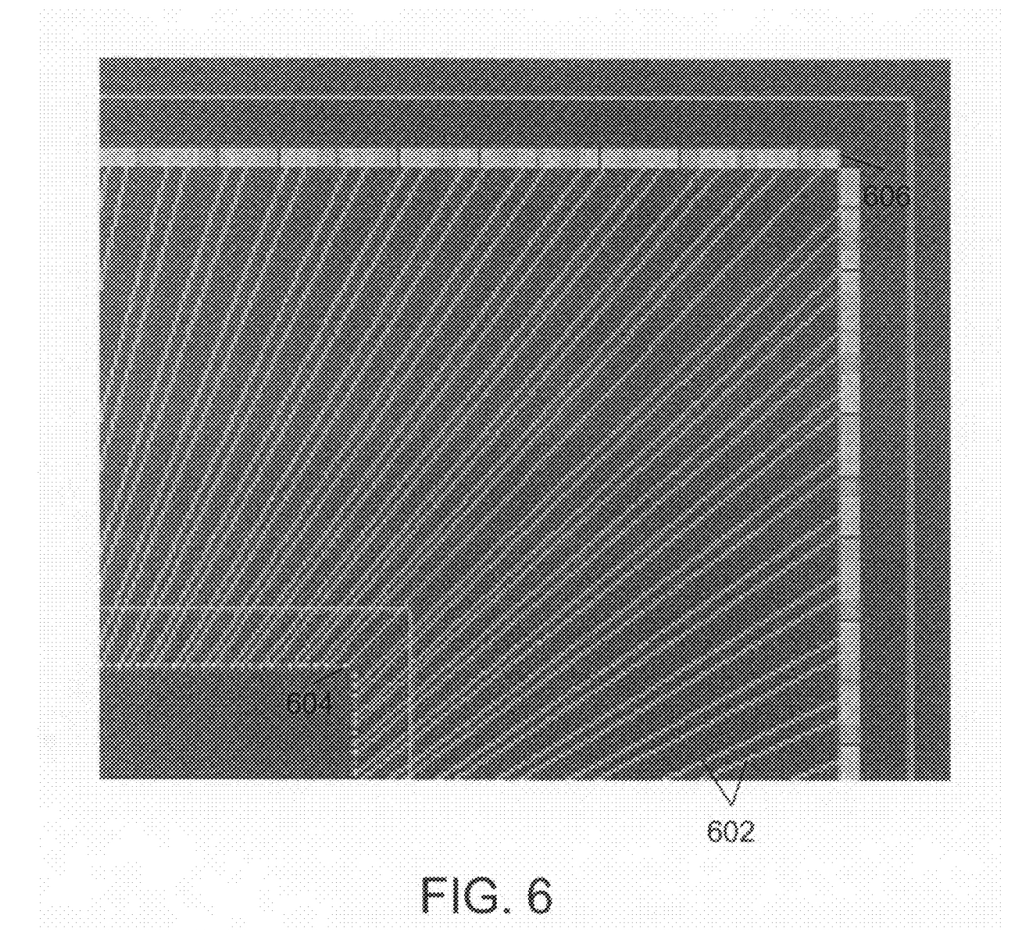
FIG. 6 illustrates example die-to-die flight lines, in accordance with an embodiment of the present invention.

FIG. 6 illustrates example die-to-die flight lines 602, in accordance with an embodiment of the present invention. The die-to-die wirebonding is performed, based on flight lines 602 and net scheduling of the nets of the selected die pads. Flight lines 602 approximating the direction of the cursor movement are converted into a single, straight-line segment connecting pins 604 and 606. The die-to-die wirebonding includes modification in the profile of a wire and the corresponding changes in the z-axis. The modifications in the x- or y-axis can be made if the die is being co-designed with an IC package.

In accordance with an embodiment of the present invention, the details of wirebond pattern 100 can be specified in an extensible markup language (XML) format and can be saved in a file. An XML DTD definition can be used for specifying the details of wirebond pattern 100. The details of wirebond pattern 100 include at least one of size and shape of bond fingers 104, 2D location of bond fingers 104, start and end of guide paths 106, power and ground ring boundaries, and the wirebond pattern settings. The XML file can be scaled and imported into another design. This would result in making wirebond pattern 100 usable for multiple die sizes.

Figure 7:
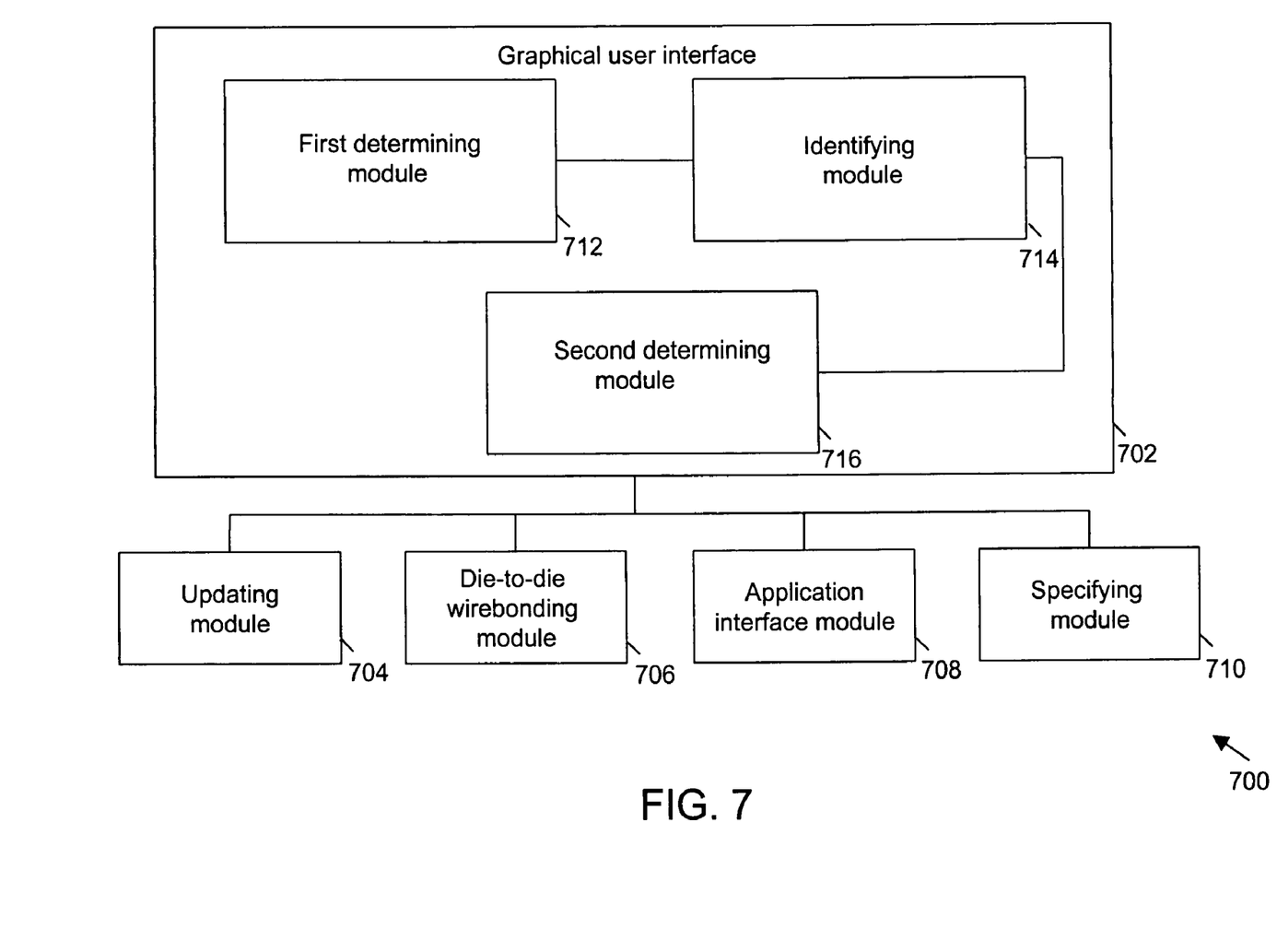
FIG. 7 illustrates a block diagram of a system for the placement of bond fingers on an IC package, in accordance with an embodiment of the present invention.

FIG. 7 illustrates a block diagram of a system 700 for placement of bond fingers 104 on an IC package, in accordance with an embodiment of the present invention. System 700 includes a graphical user interface 702, an updating module 704, a die-to-die wirebonding module 706, an Application Interface (API) module 708, and a specifying module 710. Graphical user interface 702 includes a first determining module 712, an identifying module 714, and a second determining module 716.

Graphical user interface 702 facilitates the interface of first determining module 712, identifying module 714, and second determining module 716 with the user through a cursor control device. The cursor is positioned by the user while determining the placement of the selected bond fingers. The placement of the selected bond fingers is determined by first determining module 712. Further, graphical user interface 702 provides the image of the first selected bond finger to the user. Identifying module 714 identifies the affected bond fingers and bond wires, based on the maximum clearance and spacing constraints of the first selected bond finger. Second determining module 716 determines the placement of bond fingers 104, based on the clearance rules and the affected bond fingers and bond wires that have been identified by identifying module 714.

Although FIG. 7 illustrates three separate modules, i.e., first determining module 712, identifying module 714, and second determining module 716, they could be provided as a single GUI/placement module that is called recursively with modified inputs. Thus, each recursive call can be considered as occurring via separate modules or components of a same module with different inputs/outputs, as is well appreciated by those skilled in the art.

Subsequently, updating module 704 updates the labels of the affected bond fingers and bond wires. The labels are affected due to addition, deletion or re-positioning of the affected bond fingers and bond wires.

In accordance with an embodiment of the present invention, once the user clicks to commit the movement of bond fingers 104, updating module 704 updates the labels of each of the affected bond fingers. This can be performed by first determining a set of bond fingers that have been added, moved (re-positioned), or deleted. Secondly, the non-updated labels of the set of bond fingers are looked up. Thirdly, bond fingers 104 that are not directly acted upon by the user but still affected by changes in numbering due to addition or deletion of bond fingers are computed. Fourthly, for bond fingers 104 that have been identified as affected, updating module 704 adjusts their labels with a next available label. Further, for bond fingers 104 that have been moved (re-positioned), updating module 704 adjusts their labels between the lowest and highest affected label.

In accordance with an embodiment of the present invention, an algorithmic flow can be followed while adding bond fingers 104, changing guide paths 106, or changing the settings of wirebond pattern 100.

Die-to-die wirebonding module 706 performs die-to-die wirebonding, based on flight lines 602 and the net scheduling, which is performed for the affected bond fingers identified by identifying module 714. Further, API 708 interfaces system 700 with another system.

In accordance with an embodiment of the present invention, API 708 facilitates system 700, to be used outside a wirebond placement tool. API 708 and GUI 702 can interface system 700 with another system without requiring the other system to be aware of the clearance rules.

In accordance with an embodiment of the present invention, the general requirements of API 708 include the capacity to perform the following operations:

Query whether the current wirebond pattern 100 is up-to-date.

Query whether a given change in a database will necessitate updates to wirebond pattern 100 (assuming the change has not been effected till then).

Functional call to update wirebond pattern 100, using the handle to an object passed as the start location from which wirebond pattern 100 should be adjusted, for instance, a routing trace that has been moved and the caller wants wirebond pattern 100 to clear the new position; the function should return a success or error code, as well as the number of new design rule check violations that have occurred.

Recalculate the label of each bond finger 104 in the IC

Other functions can extend API 708, to enable more specific operations, such as the addition or deletion of wirebonds.

Specifying module 710 specifies the details of the pattern of bond fingers 104 in the XML format. This results in the formation of an XML DTD definition for specifying the details of the pattern of bond fingers 104 in the XML format in a file. The XML file can be scaled and imported into another design. This would make wirebond pattern 100 usable for multiple die sizes.

In accordance with an embodiment of the present invention, the details can be stored hierarchically, i.e., from individual item details at the lowest level, to the pattern details, to the patterns of a die side, and finally to the details of the entire bond pattern of a die or the die stack. As a result, the details are stored in the XML file for the following objects:

Bond fingers 104 (placement origin and rotation+finger size and shape details)

Guide paths 106 (individual segment start and end points, plus arc radius values)

Power/ground ring boundaries (as paths)

Wirebond pattern settings (style, wire diameter and profile defaults, etc.) Further, the details can be exported and imported to other sides of the same die. This minimizes the time spent on copying parameters around the die.

Figure 8:
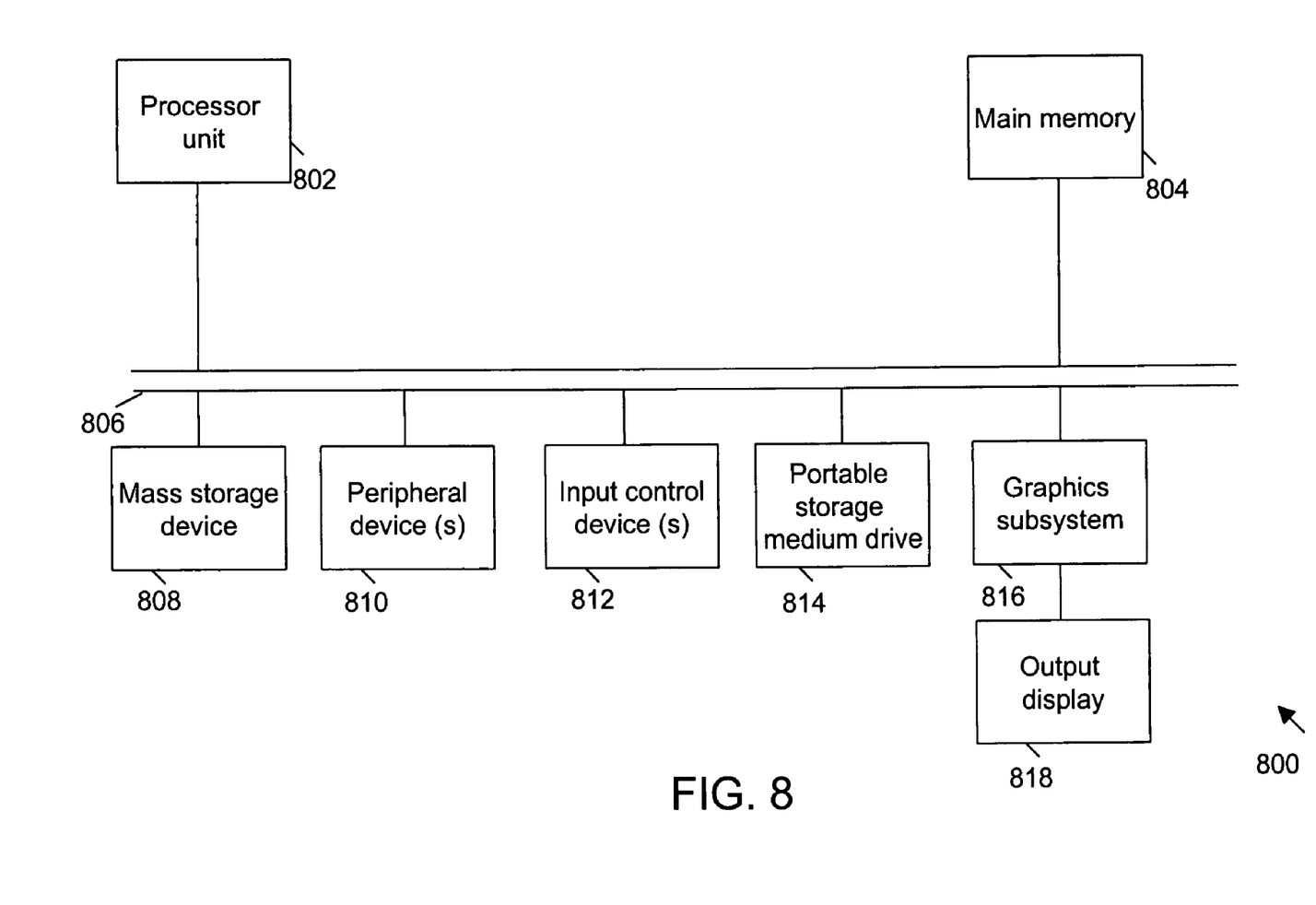
FIG. 8 is a block diagram illustrating a general-purpose computer system to execute the method for the placement of bond fingers on an IC package, in accordance with various embodiments of the present invention.

FIG. 8 is a block diagram illustrating a general-purpose computer system 800 for executing the method for placement of bond fingers 104 on an IC package, in accordance with various embodiments of the present invention.

A computer system 800 contains a processor unit 802, a main memory 804, an interconnect bus 806, a mass storage device 808, a peripheral device(s) 810, an input control device(s) 812, a portable storage medium drive(s) 814, a graphics subsystem 816, and an output display 818. Processor unit 802 can include a single microprocessor or a plurality of microprocessors for configuring computer system 800 as a multi-processor system. Main memory 804 stores, in part, instructions and data to be executed by processor unit 802. Main memory 804 can include banks of dynamic random access memory (DRAM) as well as high-speed cache memory.

For the purpose of simplicity, all the components of computer system 800 are connected via interconnect bus 806. However, computer system 800 may be connected through one or more data transport means. By way of example, processor unit 802 and main memory 804 may be connected via a local microprocessor bus; and mass storage device 808, peripheral device(s) 810, portable storage medium drive(s) 814, and graphics subsystem 816 may be connected via one or more input/output (I/O) buses. Mass storage device 808, which can be implemented with a magnetic disk drive or an optical disk drive, is a non-volatile storage device for storing data and instructions, to be used by processor unit 802. In the software embodiment, mass storage device 808 stores the software, to load it to main memory 804.

Portable storage medium drive 814 operates in conjunction with a portable non-volatile storage medium, such as a floppy disk or a compact disc read only memory (CD-ROM), to input and output data and code to and from computer system 800. In one embodiment, the software is stored on such a portable medium, and is input to computer system 800 via portable storage medium drive 814. Peripheral device(s) 810 can include any type of computer support device such as an input/output (I/O) interface, to add additional functionality to computer system 800. By way of example, peripheral device(s) 810 can include a network interface card, to interface computer system 800 to a network.

Input control device(s) 812 provide a portion of the user interface for a computer system 800 user. Input control device(s) 812 may include an alphanumeric keypad for inputting alphanumeric and other key information; a cursor control device such as a mouse, a trackball or stylus; or cursor direction keys. In order to display textual and graphical information, computer system 800 contains graphics subsystem 814 and output display 818. Output display 818 may include a cathode ray tube (CRT) display or liquid crystal display (LCD).

Graphics subsystem 816 receives textual and graphical information, and processes the information for output-to-output display 818. The components of computer system 800 are those that are typically found in general-purpose computer systems, and, in fact, these components are intended to represent a broad category of such computer components that are well known in the art.

For software implementation, the software for placement of bond fingers 104 in the IC includes a plurality of computer executable instructions, to be implemented on a general-purpose computer system. Prior to loading it into a general-purpose computer system, the software for placement of bond fingers 104 may reside as encoded information on a computer-readable medium such as a magnetic floppy disk, a magnetic tape or a compact disc read only memory (CD-ROM). In one hardware implementation, the software for placement of bond fingers 104 may comprise a dedicated processor comprising processor instructions for performing the functions described herein. Circuits may also be developed to perform these functions.

Various embodiments of the invention relate to an algorithm for dynamic placement and adjustment of various bond fingers on the IC package. The algorithm caters to wirebonding, i.e. a 3D routing problem. The algorithm is designed for high performance and real-time pattern manipulation. Further, the algorithm can be extended to automate pattern generation based on pre-defined user parameters. Furthermore, the algorithm provides maximum flexibility for fine-tuning at the end of the design cycle, while offering rapid early placement and feedback to the user on possible problems.

Such an algorithm involves determining the placement of the various bond fingers selected by the user. Subsequently, the affected bond fingers and wires, which are further used to determining the placement of bond fingers, are identified. This is performed in an interactive manner with the user. Further, the user is provided with full interactive access and control over the algorithm.

Various embodiments of the present invention facilitate dynamic placement and adjustment of bond fingers. The placement of bond fingers is carried out in an interactive manner with the user. The user selects the first and subsequent selected bond fingers. The placement of bond fingers is then performed, based on these selected bond fingers. While the user moves the selected fingers, the algorithm determines the localized area of affect for these changes. This area, which expands, contracts, and shifts as the cursor is moved, identifies bond fingers or the wires that must be adjusted due to these changes. After this, the adjustment of bond fingers is carried out dynamically. Bond fingers are adjusted and simultaneously updated.

Various embodiments of the present invention relate to an API and GUI for interfacing the system for dynamic placement and adjustment of the various bond fingers with another system. This facilitates updating of the wirebond pattern, without understanding the clearance rules.

Various embodiments of the invention support the API level, so that users may adjust a wirebond pattern when events take place. As a result, if the user adjusts a routing trace that lies between two bond fingers, the API would allow the routing tool to adjust the finger placement, receive feedback on any problems that have occurred in the wirebonds, and act on it. This is performed without the need of understanding wirebond placement rules or algorithms. The API also is enables modifications to the die pad layout to automatically spawn updates of the wirebonds, to shift wire endpoints to align with the new pad locations.

Various embodiments of the invention relate to the formation of an eXtensible Markup Language (XML) DTD definition for specifying the details of the pattern of the various bond fingers in an XML format in a file. The XML file can be scaled and imported into another design. This would make the wirebond pattern usable for multiple die sizes.

Various embodiments of the invention relate to performing die-to-die wirebonding, based on flight lines and net scheduling for the affected nets of the affected bond fingers and bond wires. Such a die-to-die wirebonding is performed automatically.

Various embodiments of the present invention provide the ability to specify persistent additional clearance requirements between pairs of the various bond fingers. This helps to preserve routing channels.

Various embodiments of the present invention provide an ability to define multiple spacing requirements, based on net assignments and their position within the design. Various embodiments of the present invention relate to automatic labeling of the various bond fingers, based on ordering rules. These rules are controlled by the user. As a result, the user can modify any wirebond in the design while the finger numbers are updated automatically to reflect the changes. Such changes can either be addition, deletion or re-positioning of the bond fingers.

In accordance with an embodiment of the present invention, the algorithm for dynamic placement and adjustment of various bond fingers on the IC package can be used inside or outside IC packaging.

A system, as described in the present invention or any of its components, may be embodied in the form of a computer system. Typical examples of a computer system include a general-purpose computer, a programmed microprocessor, a micro-controller, a peripheral IC element, and other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A computer-implemented method for generating placement data of a plurality of bond fingers on an Integrated Circuit (IC) package, the method comprising:
   establishing an initial placement of bond fingers according to a set of clearance rules;
   selectively modifying in a computer processor, a portion of the initial placement of the bond fingers by adjusting the placement of selected bond fingers among the plurality of bond fingers; said adjusted placement occurring interactively and providing for positional re-configuration of each one of the selected and plurality of bond fingers;
   identifying other bond fingers and bond wires that conflict with the clearance rules due to the adjusted placement of the selected bond fingers; and
   determining placement of the plurality of bond fingers based on the clearance rules and the bond fingers and bond wires in conflict with the clearance rules, wherein the placement of the plurality of bond fingers occurs interactively and is dynamically determined along an arbitrarily defined guide path.

2. The method of claim 1, wherein determining placement of the selected bond fingers comprises:
   locating a guide path nearest to a selected cursor position; and
   snapping the selected cursor position to the nearest guide path to form a location of a first selected bond finger, the first selected bond finger being a bond finger present in a middle of the selected bond fingers.

3. The method of claim 2, wherein identifying bond fingers and bond wires that conflict with the clearance rules comprises:
   determining maximum clearance depending on spacing constraints of the first selected bond finger;
   providing an image of the first selected bond finger;
   converting the image of the first selected bond finger into a polygon; and
   expanding the polygon based on the maximum clearance, the bond fingers present in the expanded polygon comprising the bond fingers and bond wires that conflict with the clearance rules.

4. The method of claim 2, wherein determining placement of the plurality of bond fingers occurs based on a bonding order of the first selected bond finger, wherein the bonding order of the first selected bond finger comprises the number of bond fingers that are physically connected with the first selected bond finger.

5. The method of claim 4, wherein the step of determining placement of the plurality of bond fingers further comprises:
   computing a location for each of the selected bond fingers and the bond fingers that conflict with the clearance rules, wherein said computation is considered in a direction relative to the first selected bond finger along an arbitrarily defined guide path;
   ascertaining a second bond finger in the direction of the cursor based on the bonding order; and
   computing a first clearance between the first selected bond finger and the second bond finger, the first clearance being computed based on a pre-determined value.

6. The method of claim 5, wherein the pre-determined value comprises at least one of net assignments of the plurality of bond fingers, constraint rules for the IC design, and additional space required for routing channels between the first selected bond finger and the second bond finger.

7. The method of claim 5 further comprising:
   computing a second clearance between the second bond finger and a second selected bond finger;
   comparing the first clearance with the second clearance; and
   moving the second bond finger by an additional spacing if the second clearance is less than the first clearance, the additional spacing being equal to the difference between the first clearance and the second clearance.

8. The method of claim 1 further comprising updating labels of the bond fingers that conflict with the clearance rules, the labels being updated due to one of dynamic addition, deletion, and re-positioning of the bond fingers that conflict with the clearance rules.

9. The method of claim 1 further comprising performing die-to-die wirebonding, the die-to-die wirebonding being based on flight lines and net scheduling of the nets of selected die pads.

10. The method of claim 1 further comprising specifying the details of the pattern of the plurality of bond fingers in an eXtensible Markup Language (XML) file.

11. The method of claim 10, wherein the XML file comprises data including at least one of size and shape of the plurality of bond fingers, locations of the plurality of bond fingers, description of guide paths, power and ground ring boundaries, and the wirebond pattern settings.

12. A computer-implemented system for generating placement data of a plurality of bond fingers on an integrated circuit (IC) package, the system comprising:
   a Graphical User Interface (GUI), the GUI comprising one or more modules for establishing an initial placement of bond fingers according to a set of clearance rules; selectively modifying a portion of the initial placement of bond fingers by adjusting the placement of selected bond fingers among the plurality of bond fingers, wherein said adjusted placement occurs interactively and provides for positional re-configuration of each one of the selected and plurality of bond fingers; identifying other bond fingers and bond wires that conflict with clearance rules due to the adjusted placement of the selected bond fingers; and determining placement of the plurality of bond fingers based on the clearance rules and the bond fingers and wires in conflict with the clearance rules, wherein the placement of the plurality of bond fingers occurs interactively and is dynamically determined along an arbitrarily defined guide path; and
   a cursor control device for interacting with the GUI.

13. The system of claim 12 further comprising:
   an updating module, the updating module updating labels of the bond fingers that conflict with the clearance rules, the labels being updated due to one of dynamic addition, deletion, and re-positioning of the bond fingers that conflict with the clearance rules;
   a die-to-die wirebonding module, the die-to-die wirebonding module performing die-to-die wirebonding based on flight lines and net scheduling of the nets of selected die pads;
   an application interface module, the application interface module dynamically interfacing the system with another system; and
   a specifying module, the specifying module specifying the details of the pattern of the plurality of bond fingers in an extensible markup language (XML) file.

14. The system of claim 12 wherein the plurality of bond fingers comprise bond fingers in at least one of single, stacked die packages, and a combination thereof.

15. A computer program product for generating placement data of a plurality of bond fingers on an integrated circuit (IC) package, the computer program product comprising a computer usable medium having program instructions for:

establishing an initial placement of bond fingers according to a set of clearance rules;

selectively modifying a portion of the initial placement of bond fingers by adjusting the placement of selected bond fingers among the plurality of bond fingers, wherein said adjusted placement occurs interactively and provides for positional re-configuration of each one of the selected and plurality of bond fingers;

identifying other bond fingers and bond wires that conflict with clearance rules due to the adjusted placement of the selected bond fingers; and determining placement of the plurality of bond fingers based on the clearance rules and the bond fingers and bond wires in conflict with the clearance rules, wherein the placement of the plurality of bond fingers occurs interactively and is dynamically determined along an arbitrarily defined guide path.

16. The computer program product of claim 15 further comprising program instructions for dynamically updating labels of the bond fingers that conflict with the clearance rules, the labels being updated due to one of dynamic addition, deletion, and re-positioning of the affected bond fingers.

17. The computer program product of claim 15, wherein determining placement of the selected bond fingers comprises program instructions for:

locating a guide path nearest to a selected cursor position; and snapping the selected cursor position to the nearest guide path to form the location of a first selected bond finger, the first selected bond finger being the bond finger present in the middle of the selected bond fingers.

18. The computer program product of claim 17, wherein identifying bond fingers and wires that conflict with the clearance rules comprises program instructions for:

determining maximum clearance depending on spacing constraints of the first selected bond finger;

providing an image of the first selected bond fingers with the user;

converting the image of the first selected bond finger into a polygon; and expanding the polygon based on the maximum clearance, the bond fingers present in the expanded polygon comprising the affected bond fingers.

19. The computer program product of claim 18, wherein determining placement of the plurality of bond fingers further comprises program instructions for:

computing locations for each of the selected bond fingers and the bond fingers that conflict with the clearance rules, wherein said computation is considered in a direction relative to the first selected bond finger along an arbitrarily defined guide path;

ascertaining a second bond finger in the direction of the cursor based on a bonding order; and computing a first clearance between the first selected bond finger and the second bond finger, the first clearance being computed based on a pre-determined value.

20. The computer program product of claim 19, wherein determining placement of the plurality of bond fingers further comprises program instructions for:

computing a second clearance between the second bond finger and a second selected bond finger;

comparing the first clearance with the second clearance; and moving the second bond finger by an additional spacing if the second clearance is less than the first clearance, the additional spacing being equal to the difference between the first clearance and the second clearance.

21. The computer program product of claim 15 further comprising program instructions for performing die-to-die wirebonding, the die-to-die wirebonding being based on flight lines and net scheduling of the nets of selected die pads.

22. The computer program product of claim 15 further comprising program instructions for specifying the details of the pattern of the plurality of bond fingers in an eXtensible Markup Language (XML) file.

* * * * *

UNITED STATES PATENT AND TRADEMARK OFFICE
CERTIFICATE OF CORRECTION

PATENT NO. : 7,665,056 B1  Page 1 of 1
APPLICATION NO. : 11/354826
DATED : February 16, 2010
INVENTOR(S) : Lockman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 653 days.

Signed and Sealed this

Seventh Day of December, 2010

David J. Kappos
*Director of the United States Patent and Trademark Office*